United States Patent
Yano

(10) Patent No.: US 9,255,719 B2
(45) Date of Patent: Feb. 9, 2016

(54) VENTILATION MEMBER

(71) Applicant: NITTO DENKO CORPORATION, Ibaraki-shi, Osaka (JP)

(72) Inventor: Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 14/360,539

(22) PCT Filed: Nov. 21, 2012

(86) PCT No.: PCT/JP2012/007485
§ 371 (c)(1),
(2) Date: May 23, 2014

(87) PCT Pub. No.: WO2013/080494
PCT Pub. Date: Jun. 6, 2013

(65) Prior Publication Data
US 2014/0318374 A1    Oct. 30, 2014

(30) Foreign Application Priority Data

Nov. 28, 2011    (JP) .................................. 2011-258507

(51) Int. Cl.
*B01D 53/22* (2006.01)
*F24F 7/00* (2006.01)
(Continued)

(52) U.S. Cl.
CPC . *F24F 7/00* (2013.01); *B01D 53/22* (2013.01); *F21S 48/332* (2013.01); *F21V 31/03* (2013.01); *F24F 13/065* (2013.01)

(58) Field of Classification Search
CPC ....... B01D 19/0031; B01D 53/22; F24F 7/00; F21V 31/03; F21S 48/335; F21S 48/337

USPC .......................................... 96/4, 6, 11; 95/46
See application file for complete search history.

(56) References Cited

U.S. PATENT DOCUMENTS 5,522,769 A * 6/1996 DeGuiseppi ......................... 96/6
5,914,415 A * 6/1999 Tago .................................. 96/13
(Continued)

FOREIGN PATENT DOCUMENTS

DE    20 2006 008917    8/2006
EP    1 835 227    9/2007
(Continued)

OTHER PUBLICATIONS

Extended European Search Report for corresponding European Patent Application No. 12852582.1, Nov. 23, 2015, 7 pages.

*Primary Examiner* — Jason M Greene
(74) *Attorney, Agent, or Firm* — Hamre, Schumann, Mueller & Larson, P.C.

(57) ABSTRACT

A ventilation member (10) includes an air-permeable membrane (2), a support body (4), a cover body (6), and a column portion (8). The support body (4) has a through hole (14) serving as an air passage. The through hole (14) includes (a) a first portion (14a) having a relatively large inner diameter and (b) a second portion (14b) having a relatively small inner diameter. An annular ridge portion (12) is formed on an outer peripheral surface of the support body (4) along a circumferential direction of the support body (4). When the housing (20) has a nozzle opening portion (22), the ventilation member (10) is attached to the housing (20) by inserting the nozzle opening portion 22 into the support body 4. When the housing (20) has a recess opening portion (24), the ventilation member (10) is attached to the housing (20) by fitting the support body (4) into the recess opening portion (24).

10 Claims, 8 Drawing Sheets

(51) Int. Cl.
*F21S 8/10* (2006.01)
*F21V 31/03* (2006.01)
*F24F 13/065* (2006.01)

(56) References Cited

U.S. PATENT DOCUMENTS

| | | | |
|---|---|---|---|
| 6,364,924 B1 | 4/2002 | Mashiko et al. | |
| 2002/0090506 A1* | 7/2002 | Protzner et al. | 428/334 |
| 2009/0047890 A1* | 2/2009 | Yano et al. | 454/143 |
| 2009/0084078 A1 | 4/2009 | Furuyama et al. | |
| 2010/0227544 A1* | 9/2010 | Furuyama et al. | 454/339 |
| 2012/0174789 A1 | 7/2012 | Ono et al. | |
| 2013/0055898 A1* | 3/2013 | Yano | 96/4 |
| 2014/0137739 A1* | 5/2014 | Ishii et al. | 96/11 |
| 2014/0290489 A1* | 10/2014 | Uemura et al. | 96/4 |

FOREIGN PATENT DOCUMENTS

| | | | |
|---|---|---|---|
| EP | 1 884 695 | 2/2008 | |
| JP | 2001-143524 | 5/2001 | |
| JP | 2007-087929 | 4/2007 | |
| JP | 2007-186189 | 7/2007 | |
| JP | 2010-286378 | * 12/2010 | G01M 3/38 |
| JP | 2011-023206 | 2/2011 | |
| WO | 2010/143624 | 12/2010 | |

* cited by examiner

VENTILATION MEMBER

TECHNICAL FIELD

The present invention relates to ventilation members.

BACKGROUND ART

Ventilation members are attached to housings containing electrical/electronic components such as motors, sensors, switches, and ECUs (electronic control units). The ventilation members ensure ventilation between the interior and exterior of the housings, reduce pressure fluctuations due to temperature changes in the housings, and prevent foreign substances from entering the housings.

For example, a ventilation member disclosed in Patent Literature 1 includes a tubular body made of a thermoplastic elastomer and an air-permeable membrane welded to the tubular body, and is adapted to be attached to a housing for an electrical/electronic component by the elastic force of the thermoplastic elastomer. This ventilation member is easy to handle because it can be attached to the housing by a single operation. However, in order to attach this ventilation member to the housing, the housing need have a nozzle opening portion formed therein.

CITATION LIST

Patent Literature

Patent Literature 1: JP 2001-143524 A

SUMMARY OF INVENTION

Technical Problem

With recent development of electronically-controlled automobiles for environmental and safety reasons, the number of electrical/electronic components has also increased. With the increase in the number of electrical/electronic components, the types of housings for the components have also increased. This results in a problem that only a very small space can be allocated to one housing but a relatively large space can be allocated to another housing. For example, it is conceivable to use a space-saving ventilation structure for one housing and a conventional ventilation structure including the ventilation member of Patent Literature 1 for another housing.

In view of these circumstances, it is an object of the present invention to provide a ventilation member attachable to a plurality of different types of housings each having a structurally different opening portion.

Solution to Problem

The present invention provides a ventilation member attachable to a housing having an opening portion for ventilation. This ventilation member includes:

a cylindrical support body having a through hole serving as an air passage between an interior space and an exterior space of the housing;

an air-permeable membrane closing the through hole;

a cover body provided at a position facing the air-permeable membrane so as to protect the air-permeable membrane; and a column portion provided between the cover body and the support body, the column portion being formed integrally with both the cover body and the support body so as to fix the cover body to the support body.

In this ventilation member, the through hole includes (a) a first portion having a relatively large inner diameter and (b) a second portion having a relatively small inner diameter, an annular ridge portion is formed on an outer peripheral surface of the support body along a circumferential direction of the support body, and (i) when the housing has, as the opening portion, a nozzle opening portion projecting from a surface of the housing, the ventilation member can be attached to the housing by fitting the support body onto the nozzle opening portion so that an inner peripheral surface of the support body in the first portion is in close contact with an outer peripheral surface of the nozzle opening portion, and (ii) when the housing has, as the opening portion, a recess opening portion recessed from the surface of the housing, the ventilation member can be attached to the housing by fitting the support body into the recess opening portion so that the ridge portion is in close contact with an inner peripheral surface of the recess opening portion.

Advantageous Effects of Invention

In the ventilation member of the present invention, the annular ridge portion is formed on the outer peripheral surface of the support body. The through hole of the support body has the first portion having a larger inner diameter and the second portion having a smaller inner diameter. When the housing has a nozzle opening portion, the ventilation member is attached to the housing by fitting the nozzle opening portion into the support body. When the housing has a recess opening portion, the ventilation member is attached to the housing by fitting the support body into the recess opening portion. Thus, the ventilation member of the present invention can be attached to a plurality of different types of housings.

In particular, in the ventilation member of the present invention, the support body and the cover body are formed integrally with the column portion provided therebetween. Therefore, it is possible to reliably prevent detachment of the ventilation member or a part thereof from the housing.

DESCRIPTION OF EMBODIMENTS

Hereinafter, embodiments of the present invention will be described with reference to the drawings. The present invention is not limited to the following embodiments.

Figure 1:
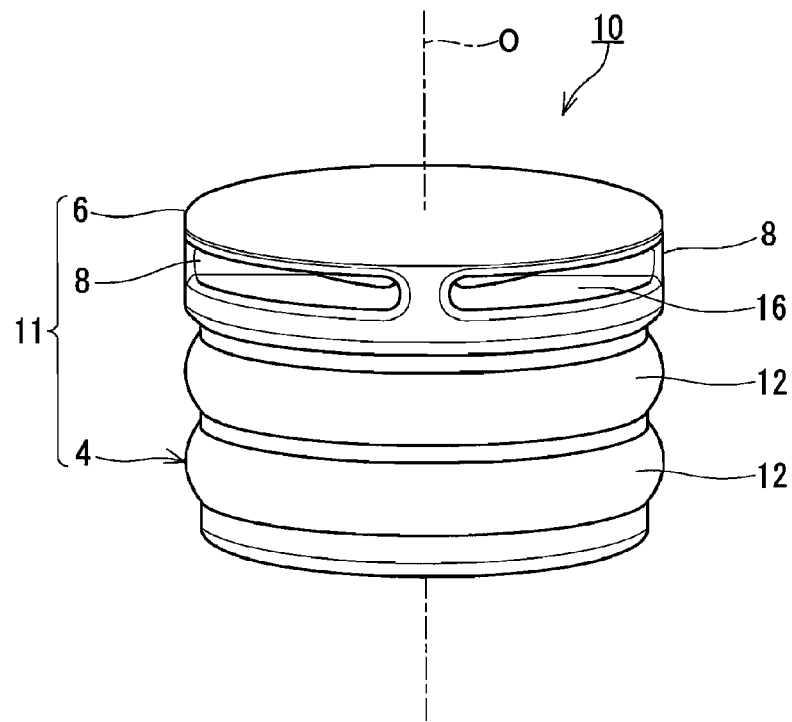
FIG. 1 is a perspective view of a ventilation member according to a first embodiment of the present invention.
Figure 2:
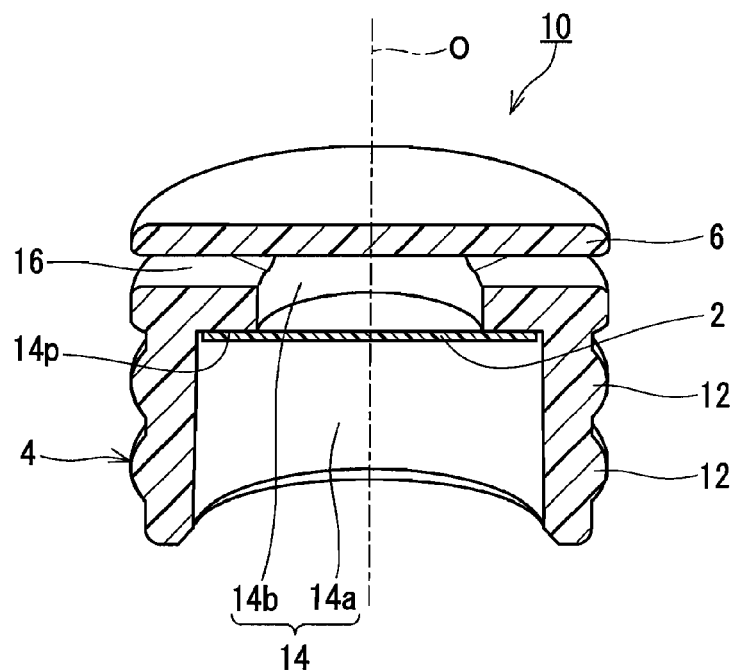
FIG. 2 is a perspective cross-sectional view of the ventilation member shown in FIG. 1.

As shown in FIG. 1 and FIG. 2, a ventilation member 10 of the present embodiment includes an air-permeable membrane 2, a support body 4, a cover body 6, and column portions 8. The support body 4, the cover body 6, and the column portions 8 form a main body 11.

Figure 3A:
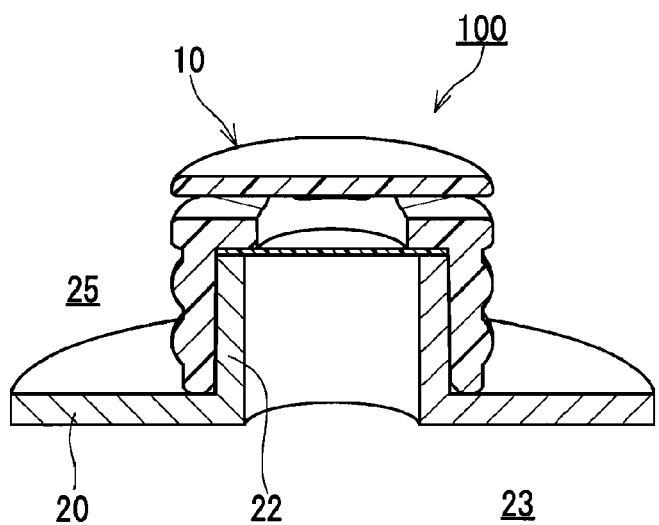
FIG. 3A is a perspective cross-sectional view of a ventilation structure including the ventilation member shown in FIG. 1.
Figure 3B:
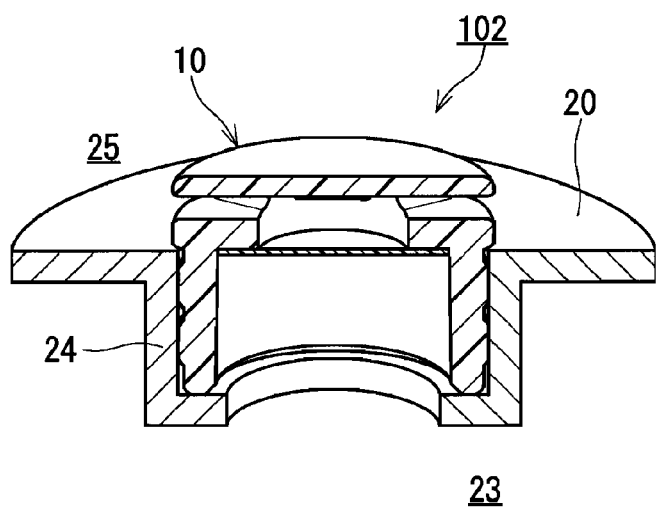
FIG. 3B is a perspective cross-sectional view of another ventilation structure including the ventilation member shown in FIG. 1.

As shown in FIG. 3A, a first ventilation structure 100 is composed of a housing 20 having an opening portion 22 and the ventilation member 10 attached to the opening portion 22. As shown in FIG. 3B, a second ventilation structure 102 is composed of the housing 20 having an opening portion 24 and the ventilation member 10 attached to the opening portion 24. The ventilation member 10 is configured to be attachable to the housing 20 having the opening portion 22 or 24 for ventilation. The housing 20 has an interior space 23 that requires ventilation. The ventilation member 10 can prevent foreign substances such as water droplets from entering the housing 20. Air can flow between the interior space 23 and the exterior space 25 through the air-permeable membrane 2. Therefore, the pressure in the interior space 23 of the housing 20 is maintained equal to that in the exterior space 25 thereof. Examples of the housing 20 include automotive ECU (electronic control unit) box and lamp box. FIG. 3A and FIG. 3B each show only a part of the housing 20.

In the ventilation structure 100 shown in FIG. 3A, the opening portion 22 is a nozzle opening portion 22 projecting from the surface of the housing 20. In the ventilation structure 102 shown in FIG. 3B, the opening portion 24 is a recess opening portion 24 recessed from the surface of the housing 20. The ventilation member 10 is a ventilation member attachable to a plurality of different types of housings 20 each having the opening portion 22 in the form of a boss or the opening portion 24 in the form of a countersink.

The detailed structure of the ventilation member 10 is described with reference to FIG. 1 and FIG. 2.

The support body 4 has a cylindrical overall shape. The support body 4 has a through hole 14 serving as an air passage between the interior space 23 and the exterior space 25 of the housing 20. The through hole 14 includes a first portion 14a and a second portion 14b. The first portion 14a is a portion into which the nozzle opening portion 22 (FIG. 3A) of the housing 20 is to be inserted and has a relatively large inner diameter D1. The second portion 14b is a portion formed coaxially with the first portion 14a and has a relatively small inner diameter D2. The first portion 14a and the second portion 14b communicate with each other when the air-permeable membrane 2 is removed. The difference (D1−D2) between the inner diameter D1 of the first portion 14a and the inner diameter D2 of the second portion 14b can be adjusted to, for example, a range of 1.6 mm or more (i.e., 0.8 mm or more in terms of the difference in the radius (D1−D2)/2).

The support body 4 further has an annular flat surface 14p formed at the boundary between the first portion 14a and the second portion 14b. In other words, the difference between the inner diameter D1 of the first portion 14a and the inner diameter D2 of the second portion 14b forms the flat surface 14p inside the through hole 14. The through hole 14 is closed by the air-permeable membrane 2 placed on the annular flat surface 14p at the boundary between the first portion 14a and the second portion 14b. With this configuration, it is possible to reliably protect the air-permeable membrane 2.

As shown in FIG. 3A, the ventilation member 10 is attached to the housing 20 by fitting the support body 4 onto the nozzle opening portion 22 so that the inner peripheral surface of the support body 4 in the first portion 14a is in close contact with the outer peripheral surface of the nozzle opening portion 22. The nozzle opening portion 22 has an outer diameter approximately equal to the inner diameter D1 of the first portion 14a. Therefore, the depth of insertion of the nozzle opening portion 22 is limited by a step (flat surface 14p) formed at the boundary between the first portion 14a and the second portion 14b. As a result, it is possible to prevent the nozzle opening portion 22 from being inserted too deeply and damaging the air-permeable membrane 2.

An annular ridge portion 12 is formed on the outer peripheral surface of the support body 4 along the circumferential direction of the support body 4. As shown in FIG. 3B, the ventilation member 10 is attached to the housing 20 by fitting the support body 4 into the recess opening portion 24 so that the outer peripheral surface of the support body 4 in the ridge portion 12 is in close contact with the inner peripheral surface of the recess opening portion 24. With this ridge portion 12 formed on the support body 4, the elastic force of the support body 4 can be reliably applied to the recess opening portion 22. As a result, it is possible to prevent detachment of the ventilation member 10 from the housing 20.

The ridge portion 12 is formed around the entire circumference (360 degrees) of the support body 4. The cross section of the support body 4 has a circular outline when observed at the position of the ridge portion 12. Therefore, when the ventilation member 10 is fitted into the recess opening portion 24, no gap is formed between the support body 4 and the recess opening portion 24. This means that the ridge portion 12 has a high sealing effect. In order to obtain a higher sealing effect, in the present embodiment, a plurality of ridge portions 12 are formed in the height direction parallel to the central axis O of the through hole 14. Specifically, two ridge portions 12 are provided in the height direction.

In the height direction parallel to the central axis O, the ridge portion 12 is located at least on the side of the first portion 14a with respect to the boundary (flat surface 14p) between the first portion 14a and the second portion 14b. In the present embodiment, the two ridge portions 12 are formed concentrically in the height direction and are formed at positions corresponding to the first portion 14a. With this configuration, it is possible to reliably fit the support body 4 into the recess opening portion 24.

In the present embodiment, in the height direction parallel to the central axis O of the through hole 14, the first portion 14a is sufficiently longer than the second portion 14b. Specifically, the first portion 14a has a length long enough to form two ridge portions 12 at positions corresponding to the first portion 14a. When the first portion 14a is sufficiently long, it is possible to provide a sufficiently long sealing length between the support body 4 and the nozzle opening portion 22 or the recess opening portion 24.

Figure 3C:
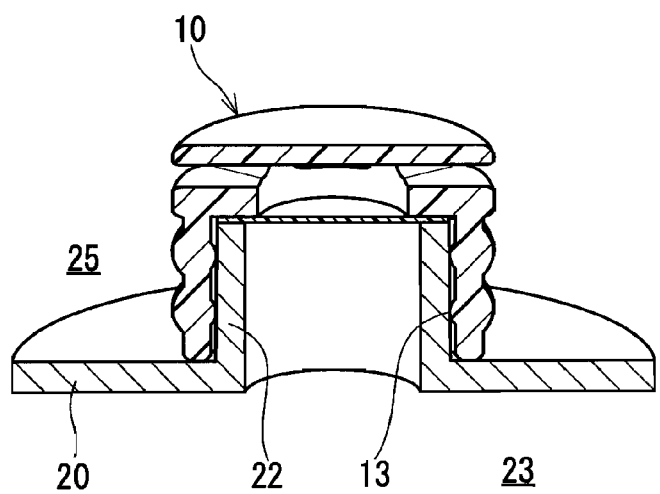
FIG. 3C is a perspective cross-sectional view of a modified form of the ventilation structure shown in FIG. 3A.

As shown in FIG. 3C, an annular ridge portion 13 may be formed on the inner peripheral surface of the support body 4. Specifically, the ridge portion 13 projecting toward the central axis O of the through hole 14 can be formed in the first portion 14a of the through hole 14. With this ridge portion 13, the elastic force of the support body 4 can be reliably applied to the nozzle opening portion 22 and thus the ventilation member 10 can be firmly fixed to the housing 20.

The cover body 6 is provided at a position facing the air-permeable membrane 2 so as to protect the air-permeable membrane 2. The cover body 6 has a circular shape in a plane view, and has an outer diameter approximately equal to that of the support body 4. A gap 16 serving as an air passage communicating with the second portion 14b of the through hole 14 is formed between the lower surface of the cover body 6 and the upper surface of the support body 4. The upper surface of the support body 4 is formed of the open end face of the second portion 14b of the through hole 14.

The column portions 8 are provided between the support body 4 and the cover body 6, and are formed integrally with both the support body 4 and the cover body 6 so as to fix the cover body 6 to the support body 4. That is, the column portions 8 each extend from the upper surface of the support body 4 toward the lower surface of the cover body 6. These column portions 8 have the following effects. Since the support body 4, the cover body 6, and the column portions 8 are formed as a single structure, the elastic force applied to the opening portion 22 or 24 is increased when the ventilation member 10 is attached to the housing 20. Therefore, it is possible to reliably prevent detachment of the ventilation member 10 from the housing 20.

In the case where the air-permeable membrane 2 could be impacted by water jets, flying stones, etc. during high-pressure car washing, the air-permeable membrane 2 can be fully protected when the ventilation member 10 is configured so as to make the air-permeable membrane 2 invisible through the gap 16. In the present embodiment, the length (height) of the column portion 8 in the height direction parallel to the central axis O is adjusted to a length long enough to form the gap 16. Specifically, the height of the column portion 8 is determined in accordance with the outer diameter of the cover body 6 and the inner diameter of the second portion 14b of the through hole 14 in order to prevent direct exposure of the air-permeable membrane 2 to water jets when the water jets are directed obliquely toward the gap 16.

Figure 4:
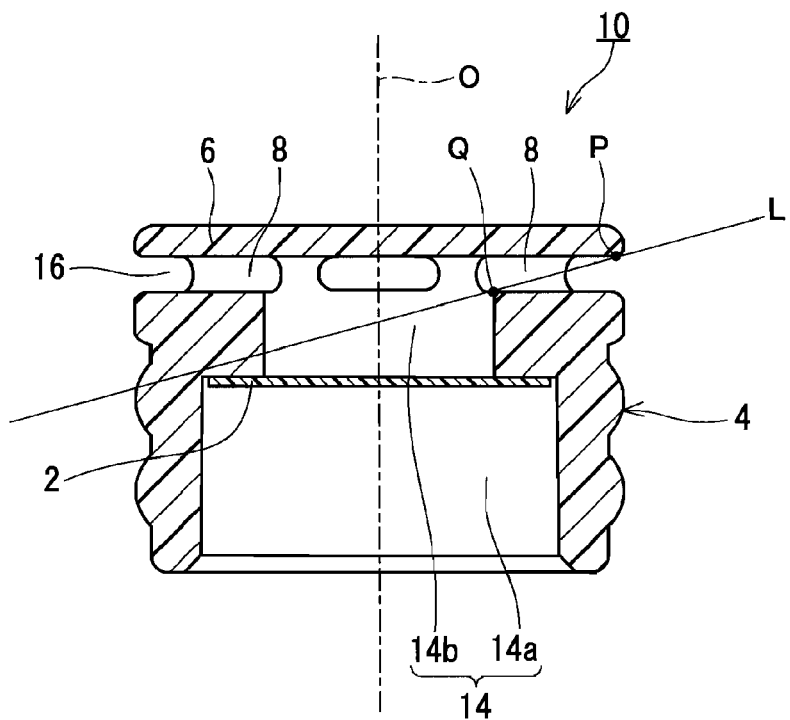
FIG. 4 is a longitudinal cross-sectional view showing a preferred dimensional relationship of the support body, the cover body, and the column portions.

More specifically, the dimensions of the support body 4, the cover body 6, and the column portion 8 can be adjusted so as to prevent a straight line L passing through the outer edge P of the lower surface of the cover body 6 and the inner edge Q of the open end face of the through hole 14 from intersecting the air-permeable membrane 2 in the longitudinal cross-section of the ventilation member 10 including the central axis O, as shown in FIG. 4. With this configuration, it is possible to fully protect the air-permeable membrane 2 from foreign substances.

Figure 5:
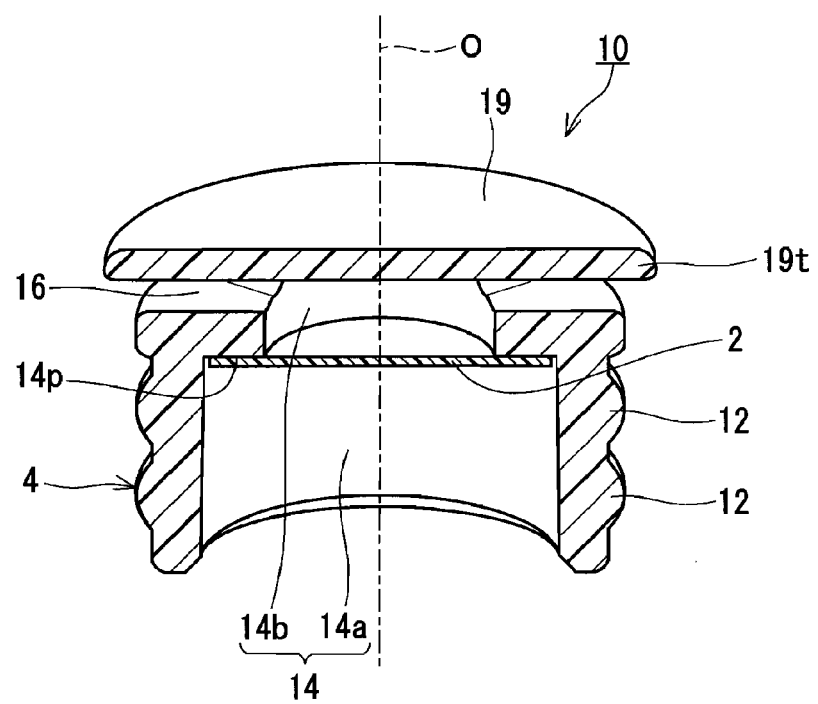
FIG. 5 is a perspective view of a modified form of the cover body.

As shown in FIG. 5, a cover body 19 having a larger outer diameter than the outer diameter of the support body 4 may be provided. As the outer diameter of the cover body 19 becomes larger than the outer diameter of the support body 4, the straight line L shown in FIG. 4 becomes more horizontal (the acute angle formed between the straight line L and the central axis O increases). The almost horizontal straight line L makes it possible to prevent direct application of external water pressure to the membrane while keeping the dimensions of other components and spaces, such as the outer diameter of the support body 4, the height of the gap 16, and the height and diameter of the second portion 14b, constant. The cover body 19 includes an outer peripheral portion 19t projecting outwardly beyond the outer peripheral surface of the support body 4 in the horizontal direction perpendicular to the central axis O. This cover body 19 can reliably prevent entry of foreign substances into the gap 16, for example, when automotive oil is dropped from above, and therefore can further enhance the function of protecting the air-permeable membrane 2. From this viewpoint, the width PT of the outer peripheral portion 19t projecting outwardly beyond the outer peripheral surface of the support body 4 is preferably, for example, 2 mm or more (4 mm or more in terms of the value obtained by subtracting the outer diameter of the support body 4 from the outer diameter of the cover body 19). The upper limit of the projecting width PT is not particularly limited, but it is preferably, for example, 4 mm or less.

Figure 6A:
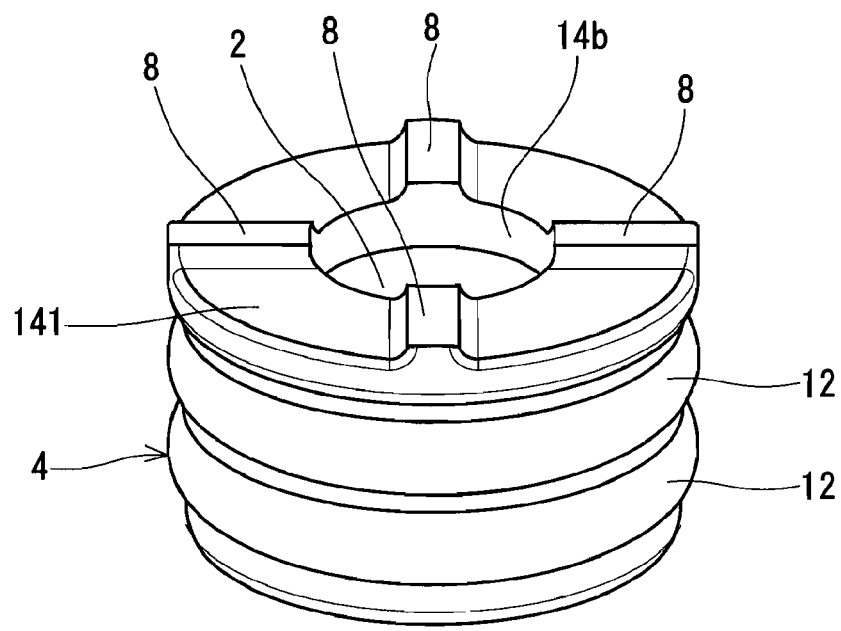
FIG. 6A is a perspective view of the ventilation member without the cover body.

FIG. 6A is a perspective view of the ventilation member 10 without the cover body 6. The column portions 8 are located on the annular open end face 141 of the second portion 14b of the through hole 14. A plurality of column portions 8 are provided at regular angular intervals on the open end face 141. In the present embodiment, four column portions 8 are provided at angular intervals of 90 degrees on the open end face 141. The plurality of column portions 8 can more reliably prevent detachment of the ventilation member 10 from the housing 20. It should be understood that the column portion 8 may be provided at only one position on the open end face 141.

Figure 6B:
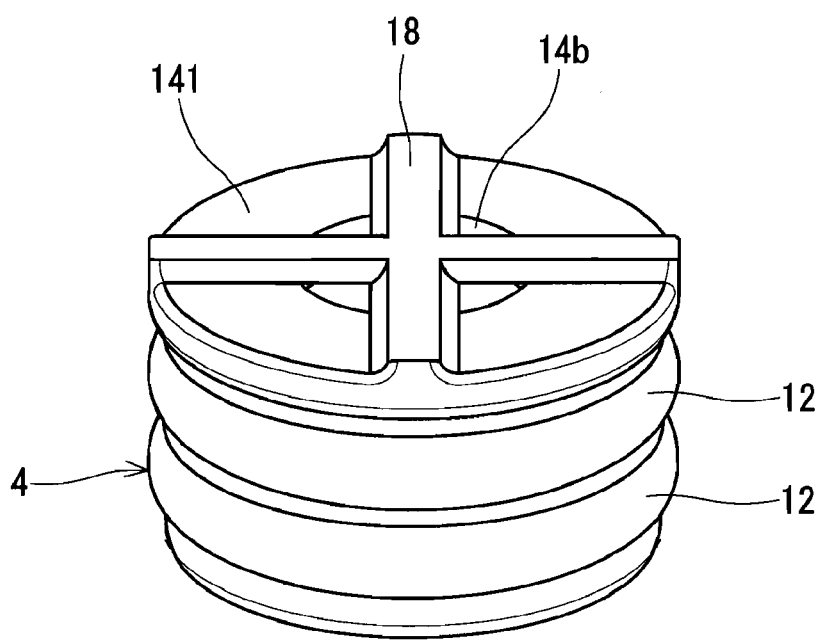
FIG. 6B is a perspective view of a modified form of the column portion.

Alternatively, a column portion 18 structured as shown in FIG. 6B may be provided. The column portion 18 is located on the annular open end face 141 of the second portion 14b of the through hole 14. In a plane view of the opening of the second portion 14b from a direction parallel to the central axis O, the column portion 18 has a bridge shape extending from a first position on the open end face 141 of the second portion 14b to a second position on the open end face 141 of the second portion 14b so that the opening of the second portion 14b is divided into two or more sections by the column portion 18. Specifically, in a plane view of the opening of the second portion 14b, the "bridge shape" of the column portion 18 is composed of bridge portions intersecting each other, and more specifically, two bridge portions form a cross shape. The bridge shape of the column portion 18 may consist of one bridge portion, but preferably it is composed of two or more bridge portions. The bridge-shaped column portion 18 increases the area of the junction between the support body 4 and the cover body 6, and when the ventilation member 10 is attached to the housing 20, a compressive load is applied uniformly in the circumferential direction of the support body 4. As a result, the compressive stress generated in the support body 4 is relaxed, and the effect of preventing detachment of the ventilation member 10 from the housing 20 is further enhanced. In addition, it is also possible to prevent deformation of the central portion of the cover body and subsequent deformation of the entire ventilation member 10 when the ventilation member 10 is press-fitted into the opening portion of the housing 20. This makes it easier to attach the ventilation member 10 to the opening portion of the housing 20.

In the present embodiment, the main body 11 (the support body 4, the cover body 6, and the column portions 8) is made of an elastomer. When the main body 11 is made of an elastomeric resin having rubber elasticity, the ventilation member 10 can be attached to the housing 20 by the elastic force of the main body 11. As will be described later, in the case where the main body 11 is produced by injection molding, a thermoplastic elastomer can be suitably used. It should be understood that rubber materials such as NBR (nitrile butadiene rubber), EPDM (ethylene propylene diene monomer rubber), silicone rubber, fluorine rubber, acrylic rubber, and hydrogenated nitrile rubber may be used as the materials for the main body 11.

The main body 11 may be made of a non-elastomeric thermoplastic resin. Examples of such a thermoplastic resin include polyamide (PA), polyethylene terephthalate (PET), polybutylene terephthalate (PBT), polyphenylene sulfide (PPS), polycarbonate (PC), and polypropylene (PP). These thermoplastic resins have excellent moldability and weldability.

The structure and material of the air-permeable membrane 2 are not particularly limited. Any membrane can be used as long as it has the properties of allowing gases to pass therethrough and preventing liquids from passing therethrough. The air-permeable membrane 2 may have a membrane main body and a reinforcing member laminated on the membrane main body. For the membrane main body, a porous membrane made of a resin such as fluorine resin or polyolefin can be used. In terms of ensuring sufficient waterproofness, a porous resin membrane having an average pore diameter of 0.01 to 10 μm can be used as the membrane main body.

The membrane main body may be subjected to liquid-repellent treatments such as an oil-repellent treatment and a water-repellent treatment. These liquid-repellent treatments can be performed by applying a substance having a low surface tension to the membrane main body, followed by drying and then curing. Any liquid-repellent agent can be used for the liquid-repellent treatment as long as a coating film having a lower surface tension than that of the membrane main body can be formed using the agent. For example, a liquid-repellent agent containing a polymer having a perfluoroalkyl group can be suitably used. The liquid-repellent agent is applied to the membrane main body by a known technique such as impregnation or spraying.

Examples of the fluorine resin suitable for use as the membrane main body include polytetrafluoroethylene (PTFE), polychlorotrifluoroethylene, tetrafluoroethylene-hexafluoropropylene copolymer, and tetrafluoroethylene-ethylene copolymer. Examples of the polyolefin suitable for use as the membrane main body include homopolymers and copolymers of monomers such as ethylene, propylene, and 4-methylpentene-1,1 butene. Porous nanofiber film materials containing polyacrylonitrile, nylon, or polylactic acid may also be used. In particular, PTFE is preferred because it has not only high air permeability per unit area but also high ability to prevent foreign substances from entering the housing. Porous PTFE membranes can be produced by known molding techniques such as stretching and extraction.

The reinforcing member can be a member made of a resin such as polyester, polyethylene, or aramid. The form of the reinforcing member is not particularly limited as long as the air permeability of the air-permeable membrane 2 can be maintained. For example, the form of the reinforcing member is a woven fabric, a nonwoven fabric, a net, a mesh, a sponge, a foam, or a porous material. The membrane main body and the reinforcing member may be laminated together by heat lamination, heat welding, or ultrasonic welding, or with an adhesive.

The thickness of the air-permeable membrane 2 is, for example, in the range of 1 μm to 5 mm, in view of the strength and the ease of fixing to the support body 4. The air permeability of the air-permeable membrane 2 is, for example, in the range of 0.1 to 300 sec/100 cm³ in terms of Gurley Number obtained by the Gurley test method specified in JIS (Japanese Industrial Standards) P 8117. The water entry pressure of the air-permeable membrane 2 is, for example, 1.0 kPa or more.

Next, a method for producing the ventilation member 10 is described.

Figure 7:
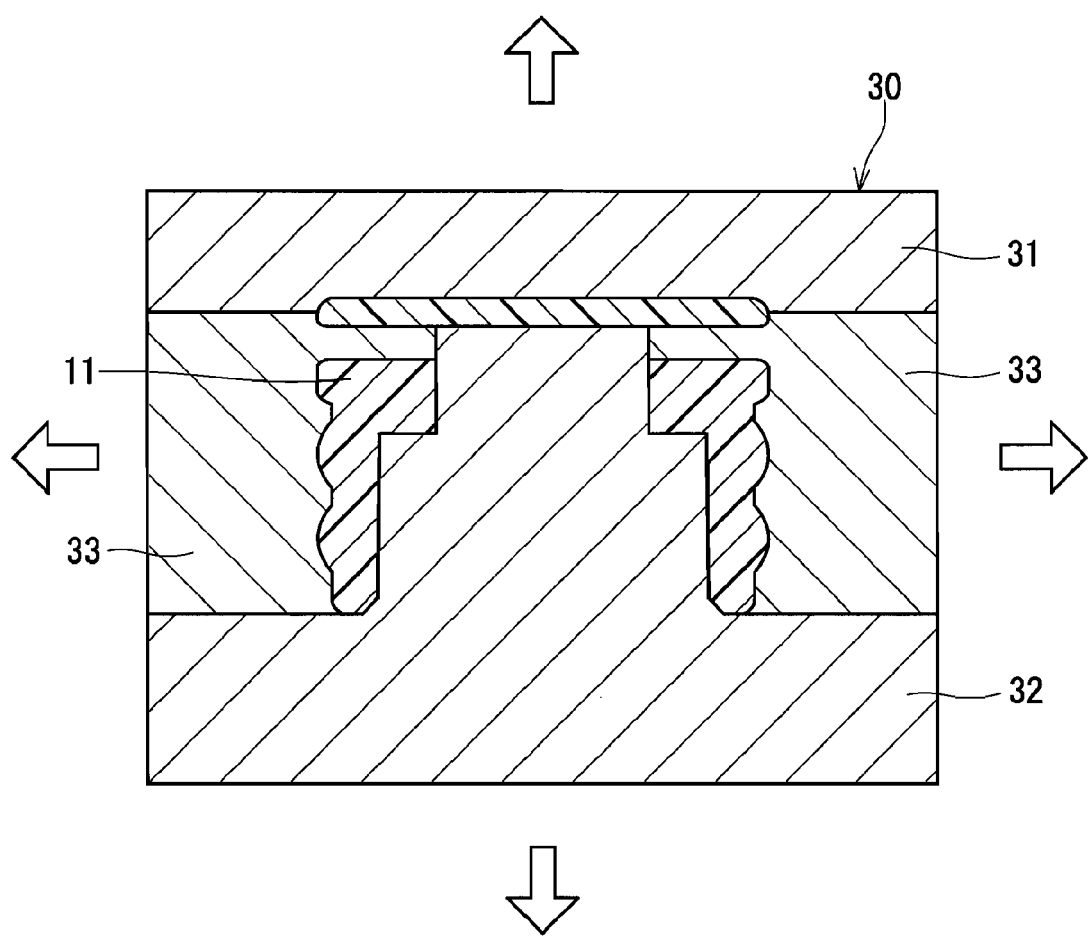
FIG. 7 is a cross-sectional view showing a method for molding a main body of the ventilation member shown in FIG. 1.

As shown in FIG. 7, the main body 11 of the ventilation member 10 can be produced by injection molding using a split mold unit 30. The split mold unit 30 includes an upper mold 31, a lower mold 32, and a plurality of slide molds 33. According to the injection molding using the split mold unit 30, the main body 11 can be formed of a single component and therefore the production cost of the ventilation member 10 can be reduced. In addition, with the use of an elastomer as the material of the main body 11, the life of the split mold unit 30 can be extended.

(First Modification)

Figure 8A:
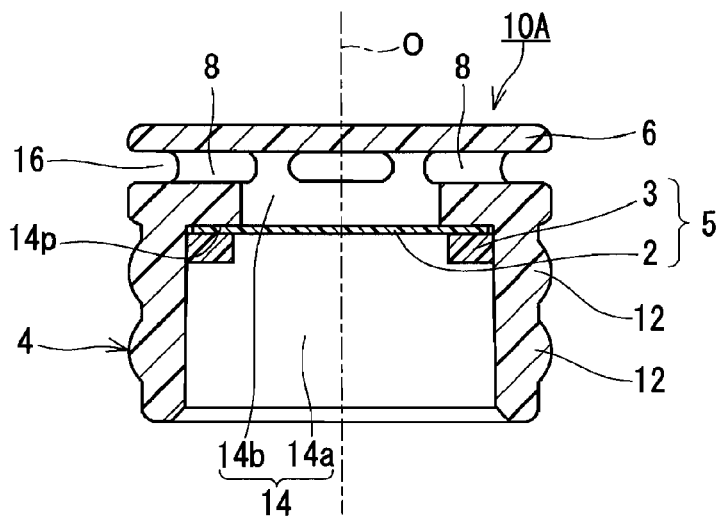
FIG. 8A is a longitudinal cross-sectional view of a ventilation member according to a first modification.

As shown in FIG. 8A, a ventilation member 10A according to the first modification includes an air-permeable membrane unit 5. The ventilation member 10A is the same as the ventilation member 10 described with reference to FIG. 1 to FIG. 7, as indicated by the same reference numerals, except for the air-permeable membrane unit 5.

The air-permeable membrane unit 5 includes the air-permeable membrane 2 and a support member 3. The support member 3 according to the first to third modifications is an annular member and is also referred to as a ring member hereinafter. The ring member 3 constitutes a part of the support body 4 in the ventilation member 10A. The air-permeable membrane 2 is fixed to the ring member 3 by a method such as bonding or welding. The material of the ring member 3 is not particularly limited, and it is, for example, a resin or a metal. The inner diameter of the ring member 3 is, for example, larger than the inner diameter of the second portion 14b of the through hole 14 and smaller than the inner diameter of the first portion 14a of the through hole 14. The outer diameter of the ring member 3 is approximately equal to the inner diameter of the first portion 14a. Since the support body 4 is made of an elastomer, the air-permeable membrane unit 5 can be fixed into the through hole 14 by the elastic force of the support body 4. More specifically, the air-permeable membrane unit 5 is disposed inside the through hole 14 so that the air-permeable membrane unit 5 is placed on (is in contact with) the annular flat surface 14p. Thereby, the through hole 14 is closed by the air-permeable membrane 2. The use of the air-permeable membrane unit 5 makes it possible to eliminate the difficulty of bonding or welding the air-permeable membrane 2 directly to the flat surface 14p. When the posture of the air-permeable membrane unit 5 in the through hole 14 is determined so that the air-permeable membrane 2 is in contact with the flat surface 14p, the nozzle opening portion 22 of the housing 20 is not in contact with the air-permeable membrane 2. As a result, the air-permeable membrane 2 can be prevented from being damaged by the nozzle opening portion 22. It should be understood that the air-permeable membrane unit 5 may be bonded or welded to the flat surface 14p.

(Second Modification)

Figure 8B:
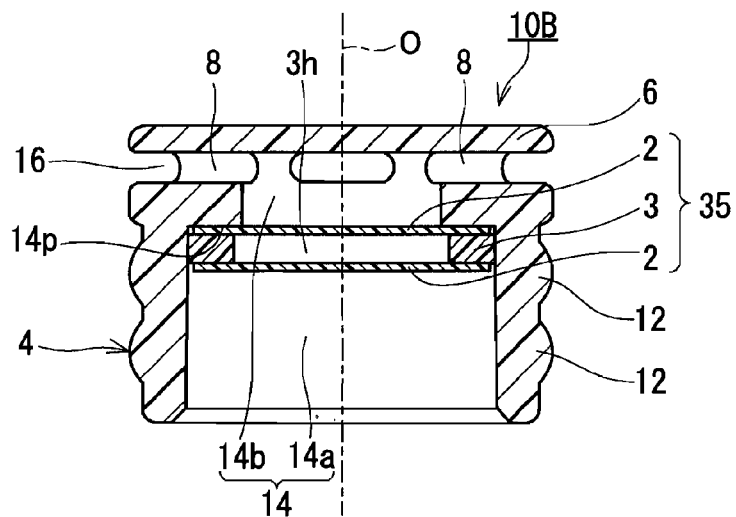
FIG. 8B is a longitudinal cross-sectional view of a ventilation member according to a second modification.

As shown in FIG. 8B, a ventilation member 10B according to the second modification includes an air-permeable membrane unit 35. The ventilation member 10B is the same as the ventilation member 10 described with reference to FIG. 1 to FIG. 7, as indicated by the same reference numerals, except for the air-permeable membrane unit 35.

The air-permeable membrane unit 35 is a member similar to the air-permeable membrane unit 5 described in the first modification. More specifically, the air-permeable membrane unit 35 includes two air-permeable membranes 2 and the ring member 3. The air-permeable membranes 2 are fixed to both surfaces of the ring member 3 by a method such as bonding or welding. Thus, the air-permeable membrane unit 35 has a double membrane structure. The air-permeable membrane unit 35 further includes a buffer space 3h enclosed by the two air-permeable membranes 2. The buffer space 3h is a space corresponding to the through hole of the ring member 3. According to the ventilation member 10B, it is possible to more reliably prevent foreign substances from entering the housing 20. In addition, according to the air-permeable membrane unit 35, even if one of the air-permeable membranes 2 is damaged, the function of the ventilation member 10B is maintained by the other air-permeable membrane 2.

(Third Modification)

Figure 8C:
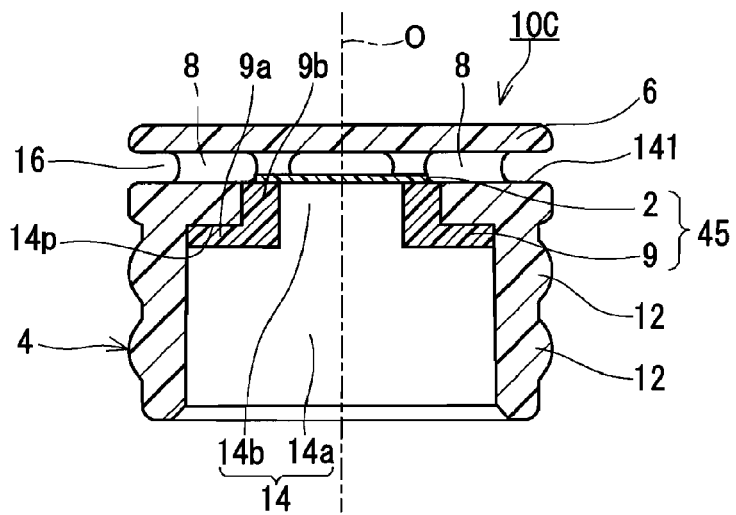
FIG. 8C is a longitudinal cross-sectional view of a ventilation member according to a third modification.

As shown in FIG. 8C, a ventilation member 10C according to the third modification includes an air-permeable membrane unit 45. The ventilation member 10C is the same as the ventilation member 10 described with reference to FIG. 1 to FIG. 7, as indicated by the same reference numerals, except for the air-permeable membrane unit 45.

The air-permeable membrane unit 45 includes the air-permeable membrane 2 and a ring member 9. The air-permeable membrane unit 45 is also a member similar to the air-permeable membrane unit 5 described in the first modification. The ring member 9 is composed of a first portion 9a having a relatively large outer diameter and a second portion 9b having a relatively small outer diameter. The inner diameter of the first portion 9a may be equal to or different from that of the second portion 9b. The air-permeable membrane 2 is disposed on the second portion 9b so as to close the through hole of the ring member 9. The air-permeable membrane unit 45 is disposed inside the support body 4 so that the second portion 9b of the ring member 9 is located in the second portion 14b of the through hole 14 and the first portion 9a of the ring member 9 is located in the first portion 14a. The air-permeable membrane unit 45 is also fixed into the through hole 14 by the elastic force of the support body 4. In the height direction parallel to the central axis O, the length of the second portion 9b of the ring member 9 is approximately equal to the length of the second portion 14b of the through hole 14. According to this air-permeable membrane unit 17, the air-permeable membrane 2 can be disposed on approximately the same level as the open end face 141 of the through hole 14.

(Fourth Modification)

Figure 9:
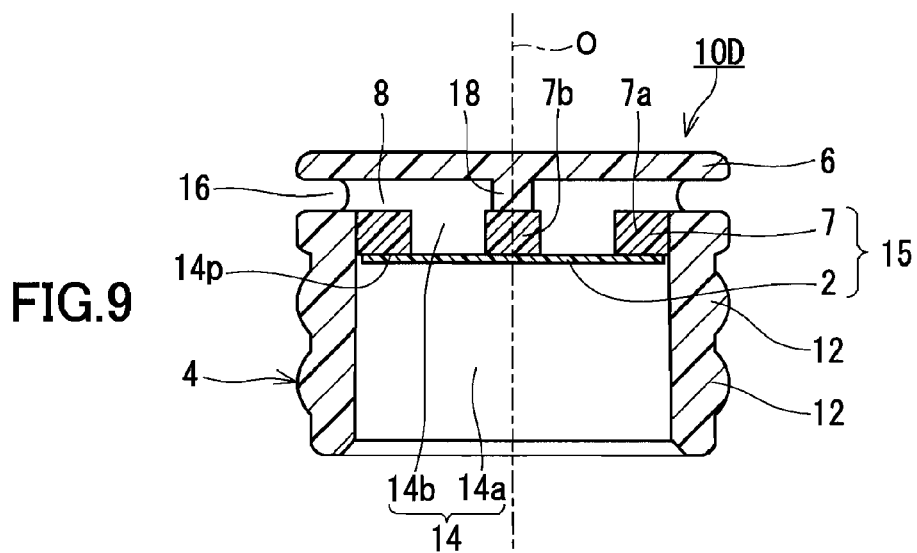
FIG. 9 is a longitudinal cross-sectional view of a ventilation member according to a fourth modification.

As shown in FIG. 9, a ventilation member 10D according to the fourth modification includes an air-permeable membrane unit 15. The ventilation member 10D is the same as the ventilation member 10 described with reference to FIG. 1 to FIG. 7, as indicated by the same reference numerals, except for the air-permeable membrane unit 15.

Figure 11:
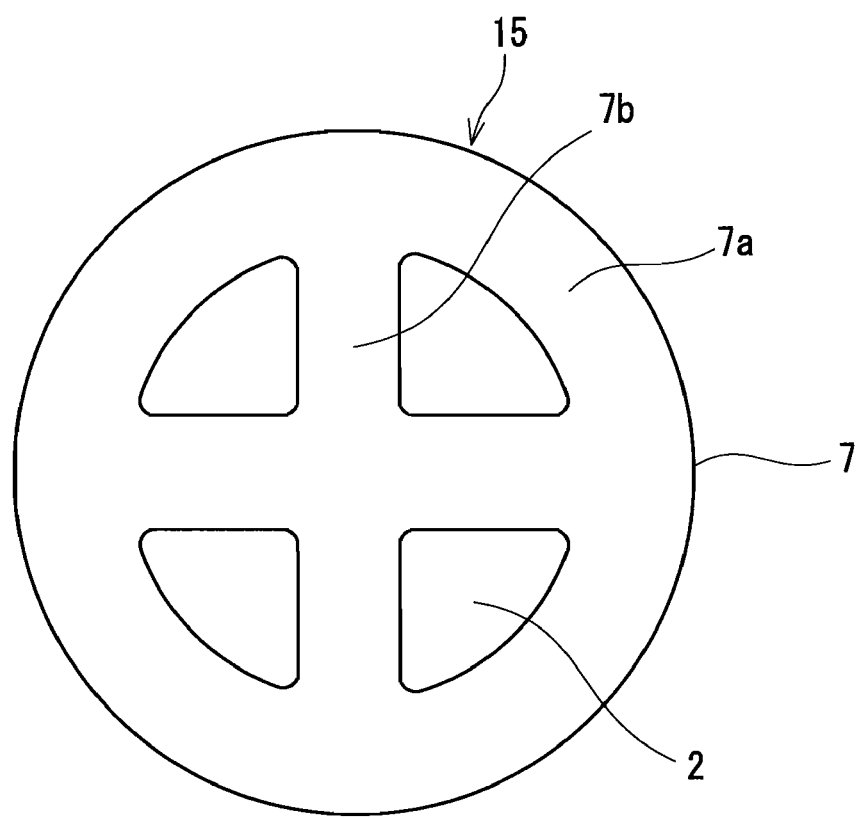
FIG. 11 is a top view of a support member shown in FIG. 9.

The air-permeable membrane unit 15 includes the air-permeable membrane 2 and a support member 7. As shown in FIG. 11, the support member 7 of the fourth modification includes a ring portion 7a and a bridge portion 7b that bridges a first part and a second part of the ring portion 7a and passes through the central axis of the ring portion 7a. The bridge portion 7b is composed of two bridge portions intersecting each other in a plane view of the surface that supports the air-permeable membrane 2 (in the state shown in FIG. 11). The bridge portion 7b in the fourth modification is in contact with the ring portion 7a on the inner peripheral surface thereof. The ring portion 7a and the bridge portion 7b of the support member 7 support the air-permeable membrane 2 from the housing-side surfaces thereof. The air-permeable membrane 2 is located at the boundary between the first portion 14a and the second portion 14b of the through hole 14.

The ventilation member 10D includes the bridge-shaped column portion 18 (see FIG. 6B) between the cover body 6 and the support body 4. The bridge portion 7b of the support member 7 extends along the column portion 18 so that the entire surface of the column portion 18 on the air-permeable membrane 2 side is covered by the support body 4. In the present embodiment, the bridge portion 7b also has a cross shape so as to conform to the cross shape of the column portion 18 in a plane view. The second portion 14b of the through hole 14 of the ventilation member 10D is formed between the inner periphery of the ring portion 7a of the support member 7 and the bridge portion 7b thereof and divided into two or more sections by the bridge portion 7b. The first portion 14a of the through hole 14 has a diameter defined by the inner periphery of the support body 4. In the ventilation member 10D, the radially inwardly projecting portion that partially reduces the diameter of the through hole 14 consists of the support member 7, unlike the ventilation members as described above. In other words, the rest of the support body 4 except for the support member 7 has a cylindrical inner peripheral surface.

Figure 10:
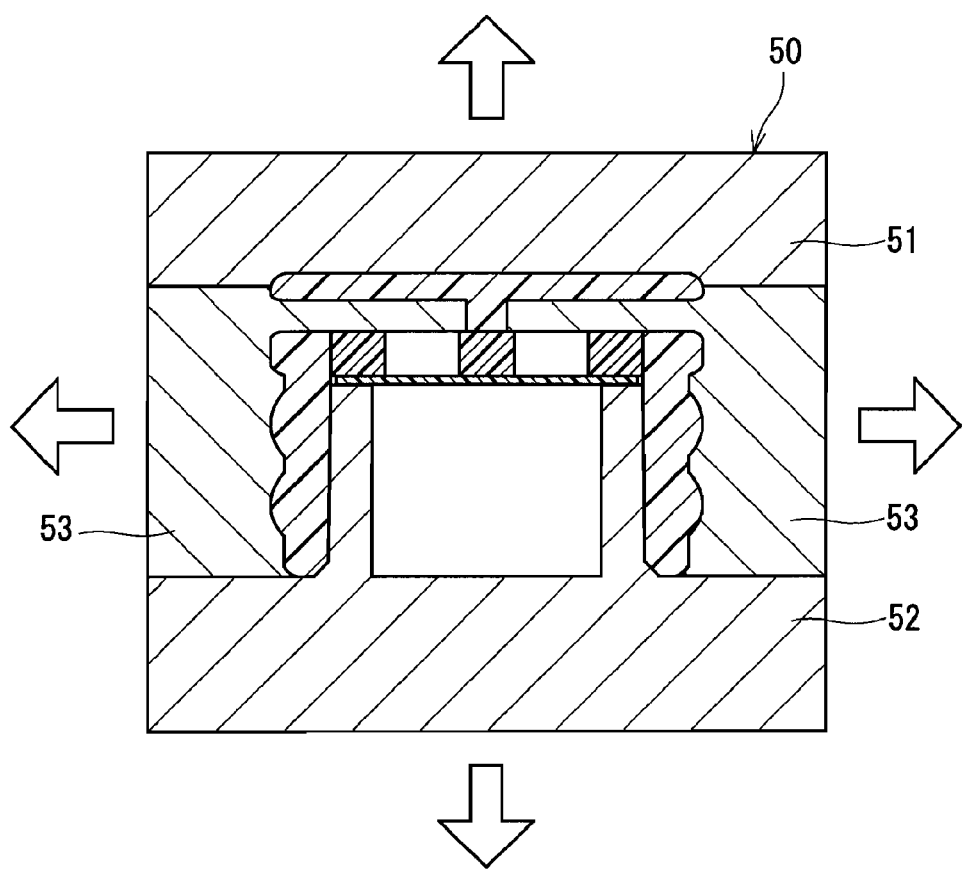
FIG. 10 is a cross-sectional view showing a method for molding a main body of the ventilation member shown in FIG. 9.

The ventilation member 10D is particularly suitable for production by so-called insert molding. FIG. 10 shows an example of a split mold unit 50 suitable for this insert molding. The split mold unit 50 is composed of an upper mold 51, a lower mold 52, and a plurality of slide modes 53. The air-permeable membrane unit 15 is placed inside the split mold unit 50 and then a resin is injected into the cavity of the mold. Thus, the ventilation member 10D including the air-permeable membrane 2 can be obtained. The bridge portion 7b of the air-permeable membrane unit 15 blocks the flow of the resin, which is injected into a space in which the column portion 18 is to be formed, toward the air-permeable membrane 2 so as to prevent the injected resin from contacting the air-permeable membrane 2. In the air-permeable membrane unit 10D thus produced, the entire air-permeable membrane 2 side surface of the bridge-shaped column portion 18, more precisely, the entire housing-side surface of the column portion 18 in the height direction parallel to the central axis O of the through hole, is covered by the support body 4, more specifically, by the support body 4 composed of the injected resin and the support member 7.

The support members 3, 7, and 9 of the air-permeable membrane units shown in the first to fourth modifications may each be made of an elastomer, but may be made of a non-elastomeric resin or a metal. In the latter case, it is preferable that the rest of the support body 4 except for the support member, the cover body 6, and the column portion 18 each be made of an elastomer so as to configure a ventilation member adapted to be attached by the elastic force of the elastomer. In this case, like the ventilation member 10D, the ventilation member can be configured such that the rest of the support body 4 made of the elastomer and the column portion 18 are connected together. In this configuration, the portion made of the elastomer (the rest of the support body 4, the cover body 6, and the column portion 18) are integrally formed. Therefore, the stiffness of the ventilation member increases, and thus when it is press-fitted into the opening portion of the housing, its resistance to detachment from the housing improves.

INDUSTRIAL APPLICABILITY

The ventilation member of the present invention can be used in housings for automotive components such as lamps, motors, sensors, switches, ECUs, and gear boxes. Furthermore, the ventilation member of the present invention can be used not only for the automobile components but also in electrical appliances such as mobile communication devices, cameras, electric shavers, electric toothbrushes, and washing machines (for example, humidity sensors in washing machines).

The invention claimed is:

1. A ventilation member attachable to a housing having an opening portion for ventilation, the ventilation member comprising:
  a cylindrical support body having a through hole serving as an air passage between an interior space and an exterior space of the housing;
  an air-permeable membrane closing the through hole;
  a cover body provided at a position facing the air-permeable membrane so as to protect the air-permeable membrane; and
  a column portion provided between the cover body and the support body, the column portion being formed integrally with both the cover body and the support body so as to fix the cover body to the support body,
  wherein
  the through hole includes (a) a first portion having a relatively large inner diameter and (b) a second portion having a relatively small inner diameter,
  an annular ridge portion is formed on an outer peripheral surface of the support body along a circumferential direction of the support body,
  the column portion is located on an annular open end face of the second portion of the through hole,
  in a plane view of an opening of the second portion, the column portion has a bridge shape extending from a first position on the open end face of the second portion to a second position on the open end face of the second portion so that the opening of the second portion is divided into two or more sections by the column portion, and
  (i) when the housing has, as the opening portion, a nozzle opening portion projecting from a surface of the housing, the ventilation member can be attached to the housing by fitting the support body onto the nozzle opening portion so that an inner peripheral surface of the support body in the first portion is in close contact with an outer peripheral surface of the nozzle opening portion, and (ii) when the housing has, as the opening portion, a recess opening portion recessed from the surface of the housing, the ventilation member can be attached to the housing by fitting the support body into the recess opening portion so that the ridge portion is in close contact with an inner peripheral surface of the recess opening portion.

2. The ventilation member according to claim 1, wherein in the plane view of the opening of the second portion, the bridge shape is composed of two or more bridge portions intersecting each other.

3. The ventilation member according to claim 1, wherein
  the support body further has an annular flat surface formed at a boundary between the first portion and the second portion, and
  the air-permeable membrane is disposed on the annular flat surface so as to close the through hole at the boundary.

4. The ventilation member according to claim 1, wherein in a height direction parallel to a central axis of the through hole, the ridge portion is located at least on a side of the first portion with respect to a boundary between the first portion and the second portion.

5. The ventilation member according to claim 1, wherein the cover body includes an outer peripheral portion projecting outwardly beyond the outer peripheral surface of the support body in a horizontal direction perpendicular to a central axis of the through hole.

6. The ventilation member according to claim 1, wherein in a height direction parallel to a central axis of the through hole, the first portion is longer than the second portion.

7. The ventilation member according to claim 1, wherein the support body, the cover body, and the column portion are made of an elastomer.

8. The ventilation member according to claim 1, wherein
  a part of the support body is a support member that supports the air-permeable membrane and is made of a non-elastomeric resin or a metal,
  the rest of the support body except for the support member, the cover body, and the column portion are made of an elastomer, and
  the rest of the support body and the column portion are connected together.

9. The ventilation member according to claim 1, wherein in a height direction parallel to a central axis of the through hole, an entire housing-side surface of the column portion having the bridge shape is covered by the support body.

10. The ventilation member according to claim 1, wherein the column portion is present between the cover body and the air-permeable membrane.

* * * * *